US012764891B2

(12) United States Patent
Lohstroh et al.

(10) Patent No.: US 12,764,891 B2
(45) Date of Patent: Oct. 13, 2026

(54) MODULAR CONTAINERIZED DATA CENTER

(71) Applicant: Giga Energy Inc., Buna, TX (US)

(72) Inventors: Matthew Lohstroh, Plano, TX (US); Brent Whitehead, Buna, TX (US); Shiv Gupta, The Woodlands, TX (US)

(73) Assignee: Giga Energy Inc., Buna, TX (US)

( * ) Notice: Subject to any disclaimer, the term of this patent is extended or adjusted under 35 U.S.C. 154(b) by 226 days.

(21) Appl. No.: 18/618,571

(22) Filed: Mar. 27, 2024

(65) Prior Publication Data

US 2025/0311141 A1 Oct. 2, 2025

(51) Int. Cl.
*H05K 7/14* (2006.01)
*H05K 7/20* (2006.01)

(52) U.S. Cl.
CPC ......... *H05K 7/1497* (2013.01); *H05K 7/1492* (2013.01); *H05K 7/20745* (2013.01)

(58) Field of Classification Search
CPC . H05K 7/1492; H05K 7/1497; H05K 7/20745
See application file for complete search history.

(56) References Cited

U.S. PATENT DOCUMENTS

| | | | | |
|---|---|---|---|---|
| 4,675,782 A * | 6/1987 | Hibbert | H02B 1/305 | 361/600 |
| 6,853,875 B1 * | 2/2005 | Moritz | G06Q 10/08 | 700/229 |
| 10,582,635 B1 * | 3/2020 | Ross | G06F 1/189 | |
| 11,406,046 B2 * | 8/2022 | Bailey | G05D 22/02 | |
| 2008/0123288 A1 * | 5/2008 | Hillis | H05K 7/20745 | 361/679.54 |
| 2014/0160672 A1 * | 6/2014 | Klaba | G06F 1/20 | 361/679.48 |
| 2021/0318735 A1 * | 10/2021 | Barbour | H04Q 1/035 | |
| 2024/0098933 A1 * | 3/2024 | Weisemann | H05K 7/20745 | |

FOREIGN PATENT DOCUMENTS

CN 209169875 U * 7/2019

* cited by examiner

*Primary Examiner* — Zachary Pape

(57) ABSTRACT

A modular data center including an intermodal shipping container, one or more racks within an interior of the shipping container configured to hold a plurality of computing, a plurality of fans configured to draw in cool air to the computing units and exhaust hot air generated by the computing units, and a switchboard integrated within the frame at one end of the shipping container. The switchboard includes a circuit breaker to receive electrical power and distribute electrical power to the plurality computing units and fans, and is configured in a bottom-feed orientation in which a cable from an external power source that supplies electrical power to the switchboard is received to be connected from a bottom of the switchboard. The shipping container includes an opening within the bottom of the frame configured through which the cables from the external power source are received to enter the shipping container and connect to the switchboard.

9 Claims, 7 Drawing Sheets

MODULAR CONTAINERIZED DATA CENTER

FIELD

The present disclosure relates generally to modular data centers and, more specifically, to modular containerized data centers.

BACKGROUND

Data centers have come to be increasingly rely upon for computing services. A data center is a facility used to house computing systems and associated components. Data centers may include a plurality of computing systems, racks to store the computing systems, power distribution systems, cooling systems, and the like.

A modular data center is made up of pre-fabricated data center modules, in which the components are pre-designed and pre-assembled. A containerized data center is a self-contained data center which is fabricated within an intermodal shipping container and which may be shipped by ships and trucks.

SUMMARY

The present disclosure relates to a modular data center which comprises an intermodal shipping container having a frame, one or more racks configured to hold a plurality of computing units within the shipping container, fans configured to provide exterior air to the computing units and exhaust hot air generated by the computing units, and a power distribution system including a switchboard integrated within the frame at one end of the shipping container. The switchboard includes a circuit breaker to receive electrical power and distribute electrical power to the plurality computing units and fans, and is configured in a bottom-feed orientation in which a cable from an external power source that supplies electrical power to the switchboard is received to be connected from a bottom of the switchboard. The shipping container includes an opening within the bottom of the frame configured through which the cables from the external power source are received to enter the shipping container and connect to the switchboard.

DETAILED DESCRIPTION

Figure 1:
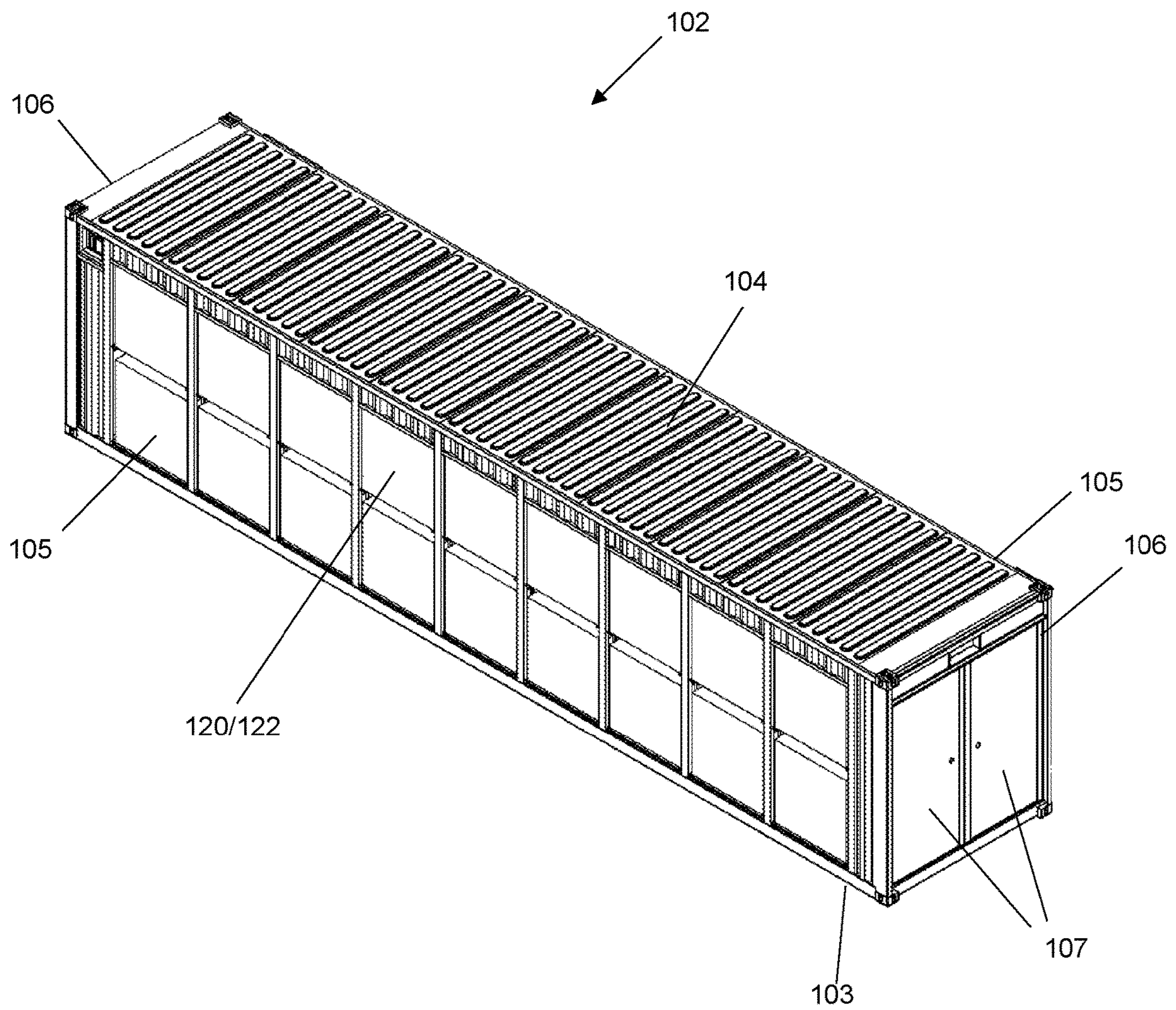
FIG. 1 is a perspective view of a modular data center according to an embodiment of the present disclosure.
Figure 2:
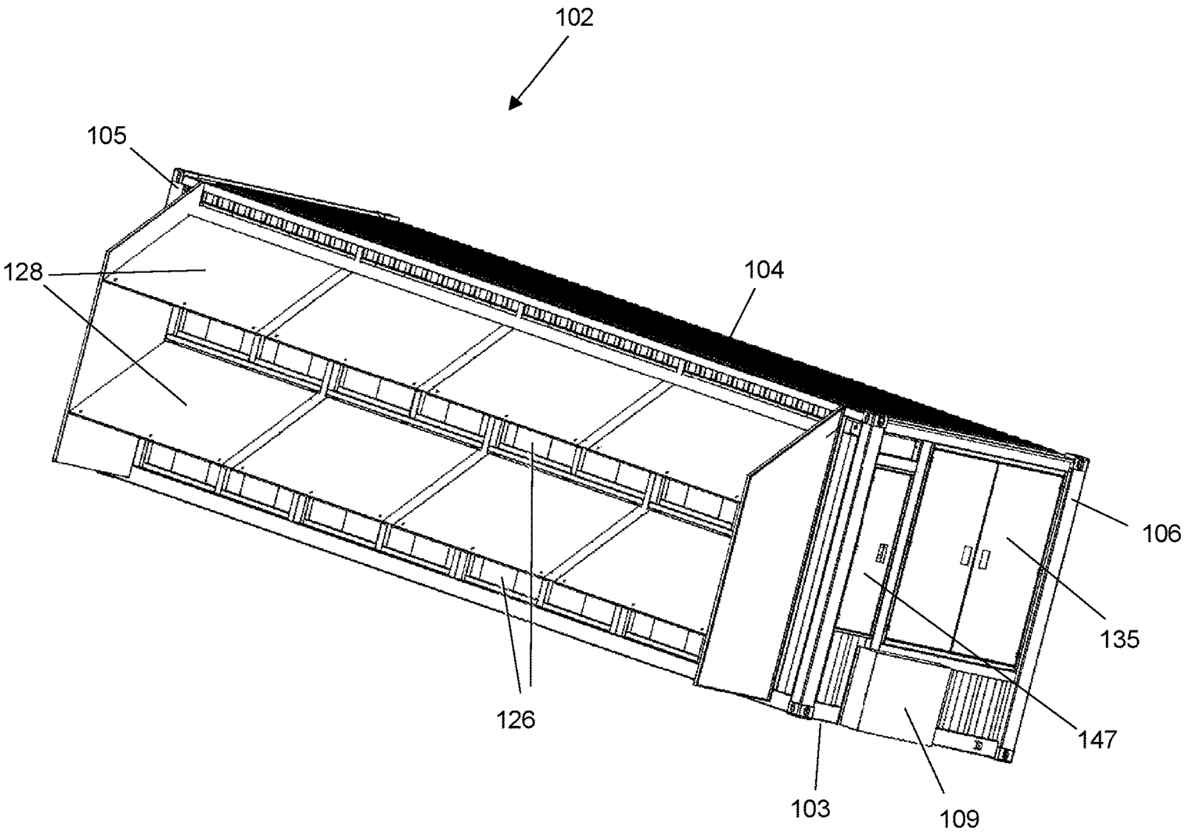
FIG. 2 is another perspective view of the modular data center of FIG. 1 showing an opposite side of the shipping container.

Embodiments of the present invention are further described in detail below with reference to the accompanying drawings and embodiments. The following examples are intended to illustrate the invention, but are not intended to limit the scope of the invention.

FIGS. 1-6 depict a data center 100 according to embodiments of the present disclosure. The data center 100 may be a containerized data center housed within a shipping container 102. The shipping container 102 may have a rectangular frame with a bottom 103, top 104, two long sides 105, and two ends 106. The shipping container 102 may include an access door or double doors 107 at one end 106 of the container to provide access to the interior of the container. The shipping container 102 may be an intermodal shipping container, which may be certified to comply with the standards set forth in the International Organization for Standardization (ISO) and the Convention for Safe Containers (CSC) to receive CSC certification.

Figure 3:
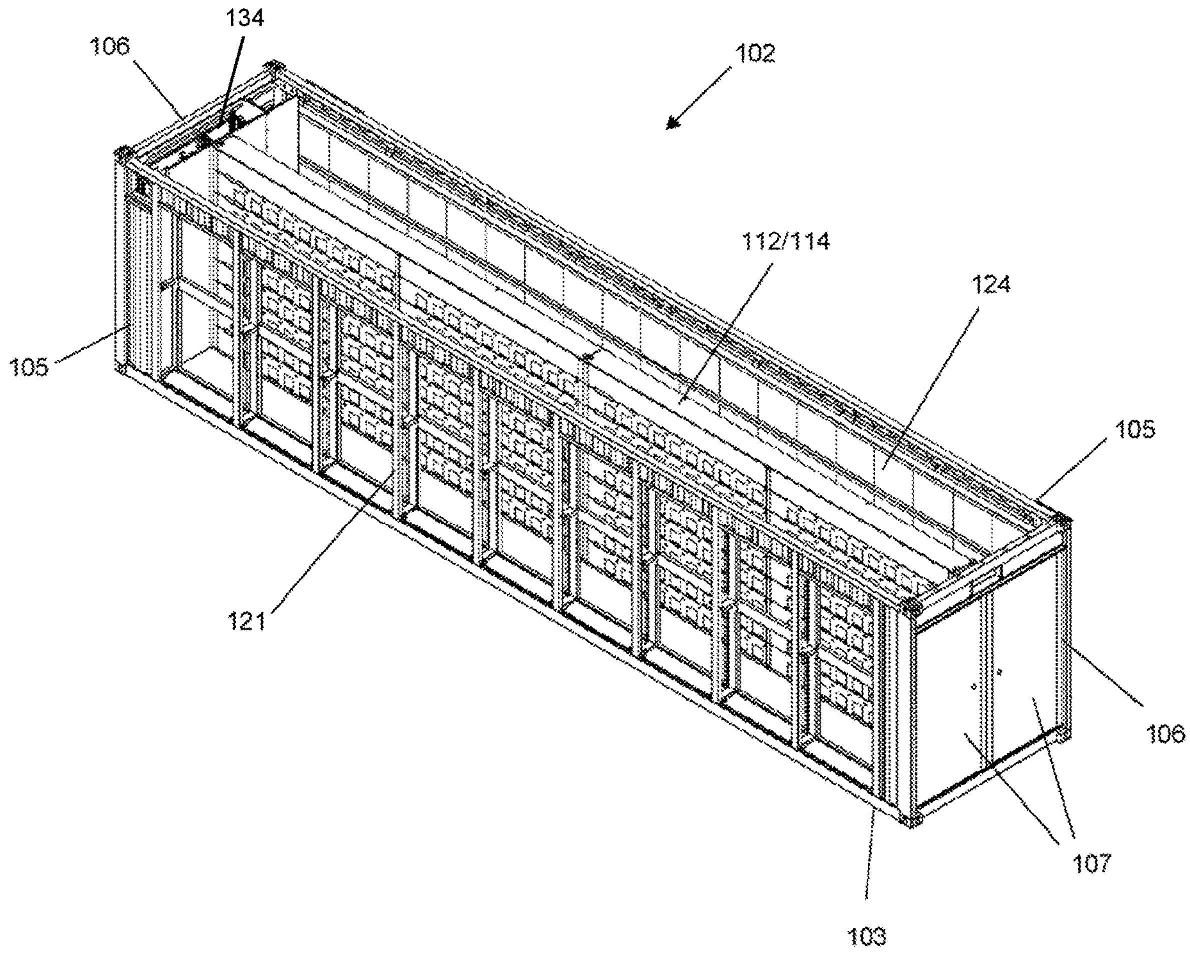
FIG. 3 is another perspective view of the modular data center of FIG. 1 with the top wall of the shipping container hidden to depict the interior of the shipping container.
Figure 4:
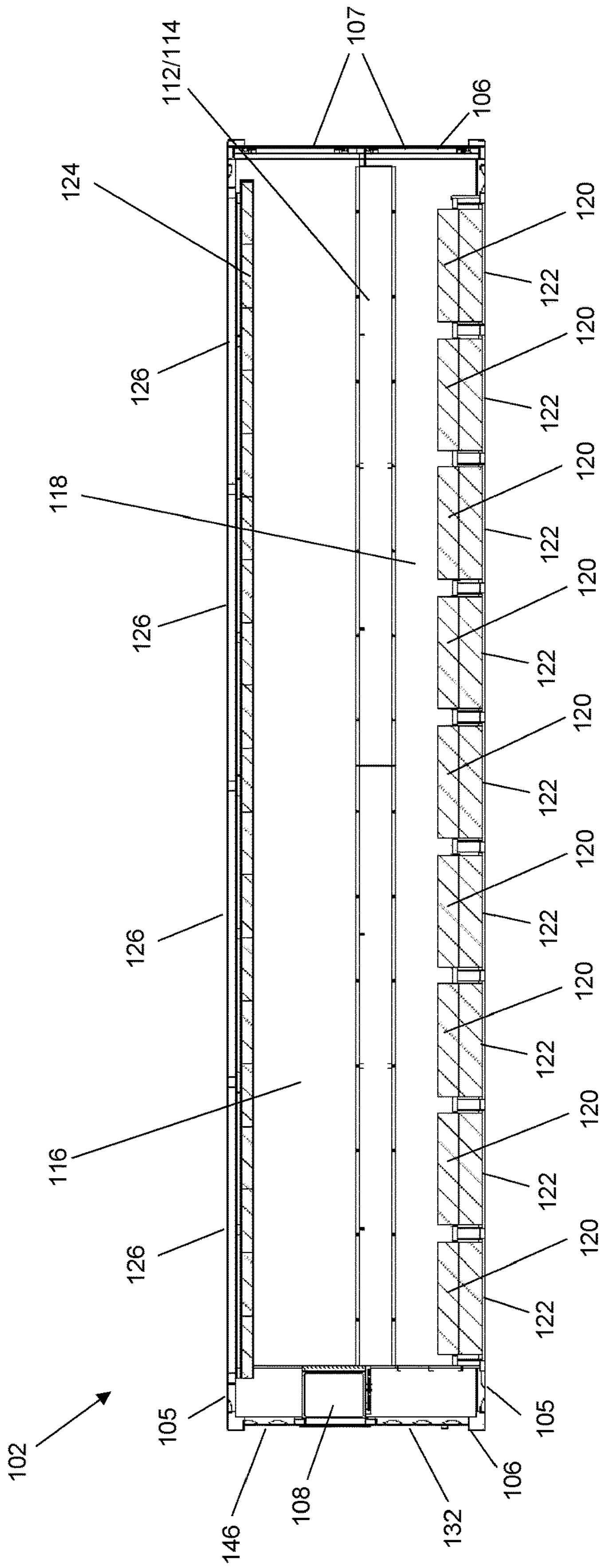
FIG. 4 is top view of the modular data center of FIG. 1 with the top wall of the shipping container hidden to depict the interior of the shipping container.
Figure 5:
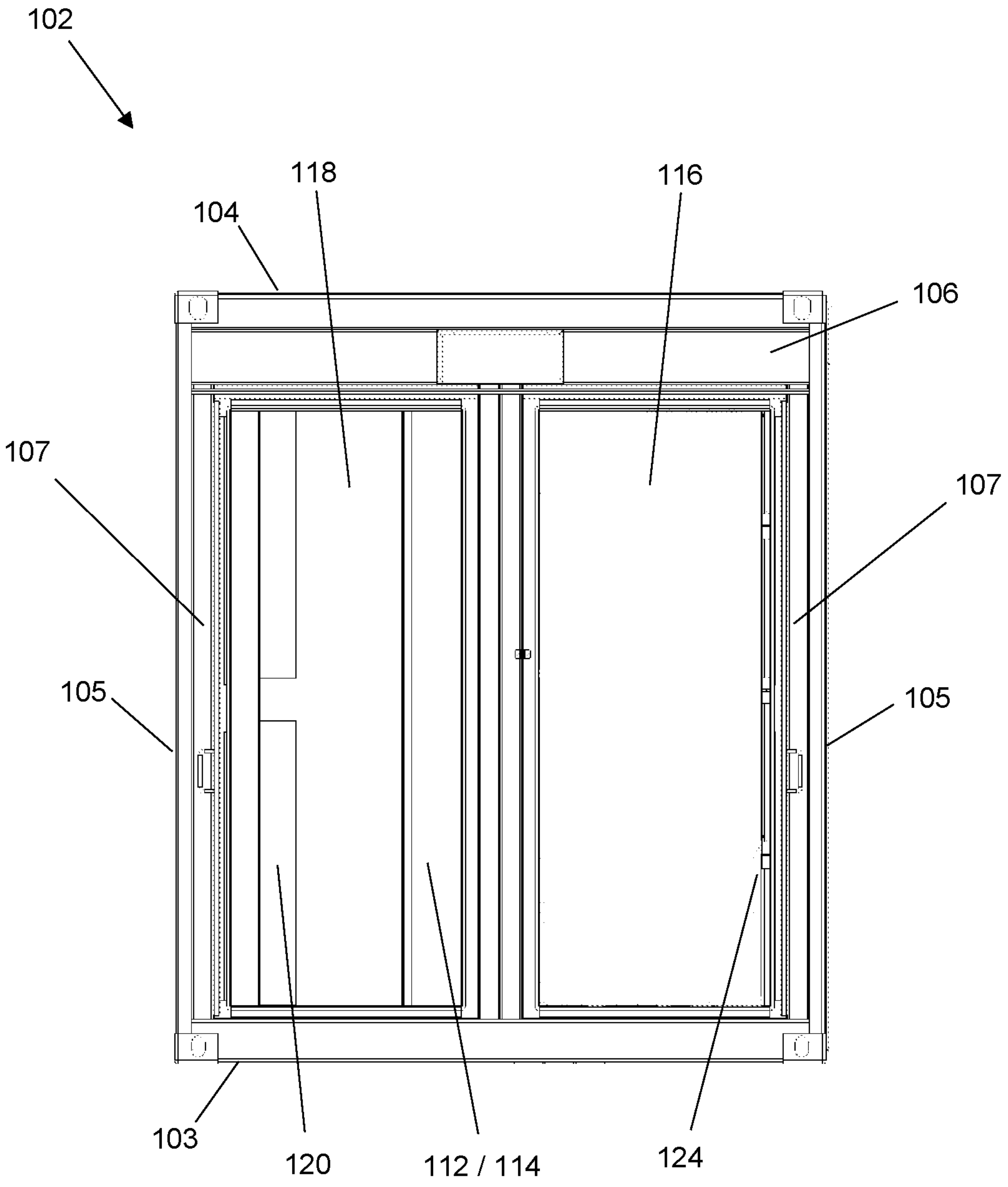
FIG. 5 is a side view of a first end of the modular data center of FIG. 1 with the interior access doors open to depict the interior of the shipping container.

As shown in FIGS. 3-5, the data center 100 may include a plurality of computing units 112 within the interior of the shipping container 102. The computing units 112 may be personal computers, computer servers, or other data processing equipment. For example, the computing units 112 may be central processing units (CPU), graphics processing units (GPU), application-specific integrated circuits (ASIC), field-programmable gate arrays (FPGA), or the like. The computing units 112 may be arranged horizontally and vertically adjacent in one or more racks or shelving units 114 within the interior of the shipping container 102. The interior of the data center 100 may be configured to have a cool aisle 116 between an intake side 105 of the shipping container 102 and the computing units 112 on the racks 114 within the center of the shipping container 102, and a hot aisle 118 between the computing units 112 on the racks 114 and an opposite, exhaust side 105 of the shipping container 102.

The data center 100 may include a plurality of fans 120 which draw in cool exterior air to cool the computing units 112 and exhaust hot air generated by the computing units 112 to the exterior. Fan bays 121 may be built into a wall on the exhaust side 105 of the shipping container 102 within which the fans 120 are installed. Air filter 124 may be provided along a wall on the intake side 105 of the interior of the shipping container 102 to filter out particles or debris contained within the intake air that is pulled into the shipping container 102 by the fans 120. Intake louvers 126 and exhaust louvers 122 may be provided along respective sides 105 of the shipping container 102 to permit and control the amount of air that enters into and/or is exhausted out of the shipping container 102 and to protect against water, debris, and contaminants from entering the shipping container 102. The louvers 122, 226 may be fixed, retractable, or adjustable, and may be gravity operated or motorized. Covers 128 may be provided over the louvers 122, 126 that may fold outward to provide further rain protection. The data center 100 may further include additional cooling systems to cool the computing units 112.

Figure 6:
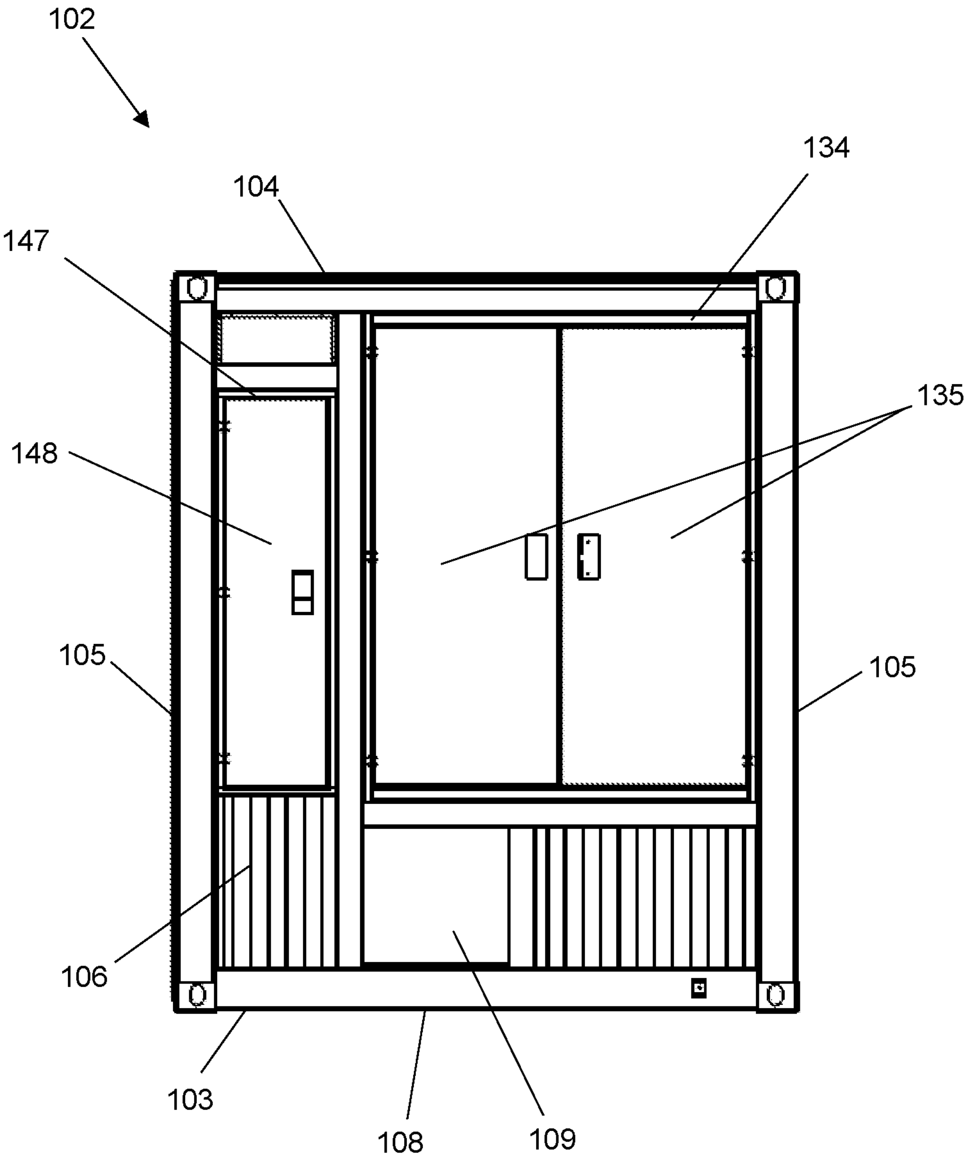
FIG. 6 is side view of a second end of the modular data center of FIG. 1.
Figure 7:
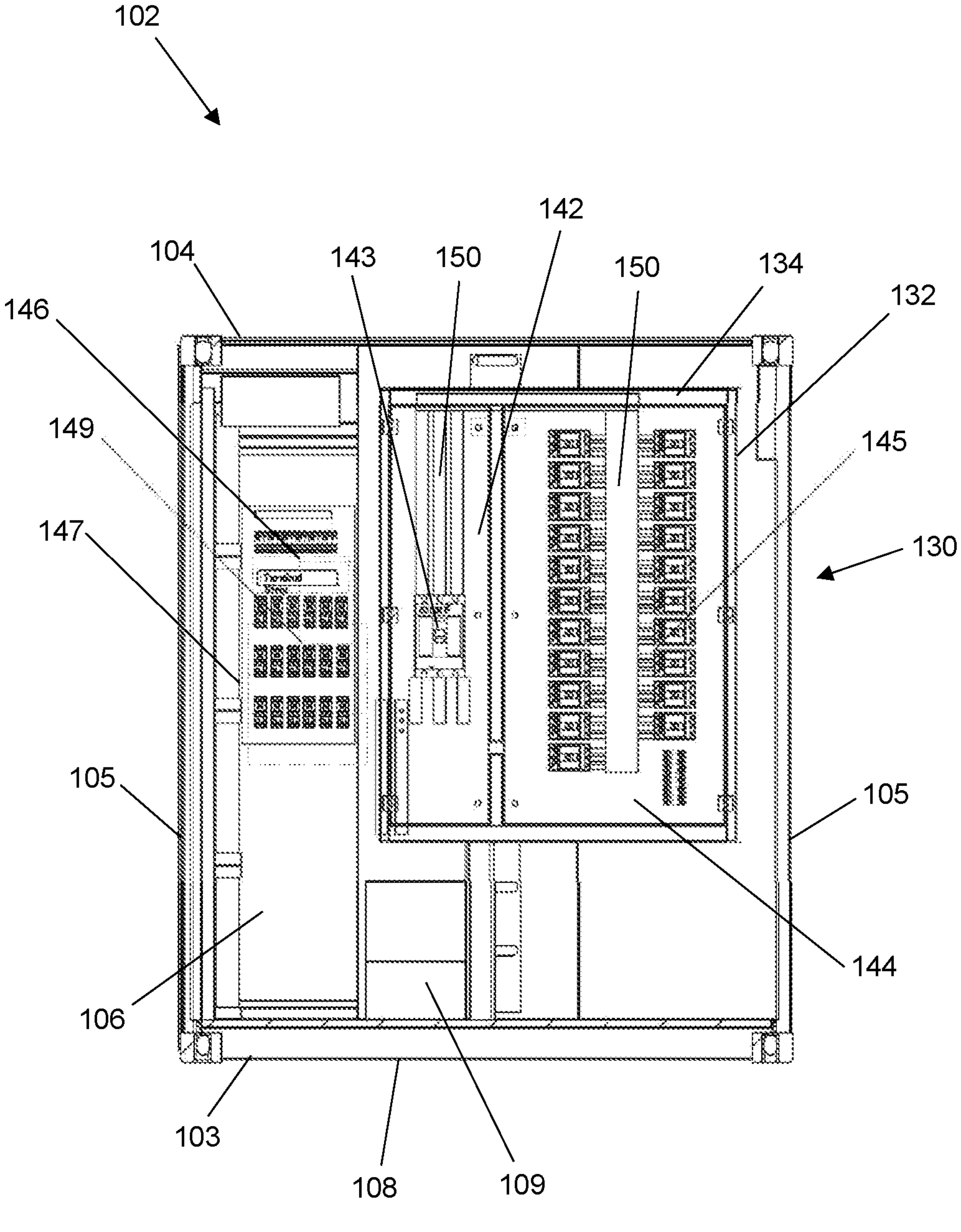
FIG. 7 is side view of a second end of the modular data of FIG. 1 with the access panels of the switchboard enclosure removed to depict the switchboard.

Referring to FIGS. 6-7, the data center 100 may include a power transmission system 130 that distributes and controls the electrical power within the data center 100. The power transmission system 130 may comprise a switchboard 132 which serves as a central point that receives electrical power from main cables 136 from an external power source (not shown), such as a utility grid or a generator, and then distributes the electrical power to the computing units 112, fans 120, cooling system, and other electrical devices, systems, equipment, and circuits within the data center 100. The switchboard 132 may also facilitate the control and protection of electrical circuits used within the data center 100.

Conventionally, modular data centers include an OEM switchboard that is mounted to an exterior side 105 or end 106 of the shipping container, and then electrical cables are routed to the inside of the shipping container through the wall of the container. With the switchboard being externally mounted the shipping container, the shipping container cannot obtain CSC certification as a standard container. According to embodiments of the present disclosure, the switchboard 132 may be built into the structure of the shipping container 102 such that it is integrated with the container. By having a switchboard 132 as an integrated part of the structure of the shipping container 102, it is possible to acquire a CSC certification on the shipping container as a "standard" container so that it may be shipped on any container vessel to any port in the world.

The switchboard 132 may be mounted on a side 105 or end 106 of the shipping container 102 so as to be outward facing toward the exterior. Preferably, the switchboard 132 is mounted on an end 106 of the shipping container 102 opposite of the interior access door 107. The switchboard 132 may be enclosed within a protective enclosure 134. The enclosure 134 may be built-in and inset within a wall of the shipping container 102. The enclosure 134 may include one or more access panels or doors 135 that can be opened to provide access to the switchboard 132 and closed to fully enclose the switchboard from the exterior of the shipping container 102 so as to prevent unauthorized access and to shield operators from electrical components.

The switchboard 132 may be configured to have a bottom feed design and/or a side feed design for connecting the cables from the external power source. In the bottom feed design, the shipping container 102 may include a pre-fabricated opening, cut-out, door, or access panel 108 in the bottom of the container. The opening 108 may be located underneath or otherwise near the location of the switchboard 132. The main or feeder cables 136 from the external power source may be routed underneath the shipping container 102 and enter into the shipping container 102 through the opening 108. The main cables 136 then may connect to the switchboard 132 through an opening at the bottom side of the switchboard. This ensures that the cables will not be exposed to the exterior and cannot be seen from the exterior. In a side feed design, the shipping container 102 may include a pre-fabricated opening, cut-out, door, or access panel 109 in the side of the container to allow the main cables 136 to enter from the side of the shipping container 102 and to connect to the switchboard 132 through an opening at a side of the switchboard.

The switchboard 132 may comprise various components, including a main breaker section 142, a distribution sections 144, circuit breakers or fuses 143, 145, 149, busbars 150, metering devices 152, and other safety features.

According to an embodiment shown in FIG. 7, the main breaker section 142 may be configured to connect to the main cables 136 from the external source, and may include a main circuit breaker or fuse 143 which can be used to disconnect the entire facility from the external power source if needed. The main breaker section 142 may incorporate access for the incoming main cables 136 in a bottom feed and/or side feed configuration.

The switchboard 132 may further comprise distribution section 144 for distributing power to various areas or loads within the facility. The distribution sections 144 may include feed circuit breakers or fuses 145 for distributing power to individual circuits. Circuit breakers and fuses are devices that protect electrical circuits from overloads or faults by interrupting the flow of electricity, and which can be manually operated or automatically tripped in the event of a fault. Busbars 150, which are conductive bars or strips, carry electrical current within the switchboard 132 and distribute power to various distribution sections 144, 145 of the switchboard 132.

One or more auxiliary breaker panels 146 may be further provided with auxiliary circuit breakers 149 for controlling the fans 120 or other systems, equipment, and circuits. The auxiliary breaker panel 146 may be mounted on a side 105 or end 106 of the shipping container 102 and enclosed within a protective enclosure 147, and preferably adjacent or proximal to the switchboard 132. The enclosure 147 may include one or more access panels or doors 148 that can be opened and closed to provide access to or fully the auxiliary breaker panel 146 from the exterior of the shipping container 102.

The switchboard 132 may further include one or more metering devices 152 to measure and monitor parameters like voltage, current, and power consumption.

The switchboard 132 may further include additional safety features to protect against electrical hazards, which may include safety interlocks, warning indicators, and emergency shutdown mechanisms.

The above description is only to preferred embodiments of the present invention and it should be noted that those skilled in the art can make improvements and modifications without departing from the technical principles of the present invention and as such, variations are also considered to be the scope of protection of the present invention.

What is claimed is:

1. A modular data center comprising:

a certified shipping container having first and second end walls, first and second side walls, and a top wall and a bottom wall;

one or more storage units within an interior of the shipping container configured to hold one or more electrical loads;

an interior access door within the first end wall at one end of the shipping container which provides access to the interior of the shipping container;

a switchboard built-in and inset within the second end wall at an opposite end of the shipping container, the switchboard comprising a circuit breaker to receive electrical power and distribute electrical power to the one or more electrical loads, wherein the switchboard is exterior-facing so as to be accessible from an exterior of the shipping container, wherein the switchboard is configured in a bottom-feed orientation in which a power cable from an external power source that supplies electrical power to the switchboard is routed for ingress through a first opening in the bottom wall of the shipping container, through the interior of the shipping container, and is received to be connected to the switchboard from a bottom of the switchboard, and wherein the interior access door, the switchboard, and the first opening in the bottom wall are configured such that structural and environmental integrity of the shipping container are maintained for certification of the shipping container.

2. The data center of claim 1, wherein the first opening includes an access panel that is configured to be opened to provide access through the first opening in the shipping container and closed to close the first opening in the shipping container.

3. The data center of claim 1, further comprising a second opening in the second end wall of the shipping container configured through which the power cable enters the shipping container and connects to the switchboard.

4. The data center of claim 1, wherein the switchboard is enclosed within an enclosure that is built-in and inset within the second end wall, the enclosure having an access panel that is configured to be opened to provide access to the switchboard and closed to fully enclose the switchboard from the exterior of the shipping container.

5. The data center of claim 1, wherein intake louvers are disposed along the second side wall of the shipping container.

6. The data center of claim 5, wherein an air filter is disposed along the second side wall of the shipping container to filter debris and contaminants from the exterior air.

7. The data center of claim 5, wherein covers are attached to the second side wall which are configured to be closed to enclose the intake louvers and opened to fold outward at an angle to expose the intake louvers while providing protection against rain from entering the shipping container through the louvers.

8. The data center of claim 5, wherein covers are attached to the second side wall which are configured to be closed to enclose the intake louvers and opened to fold outward at an angle to expose the intake louvers while providing protection against rain from entering the shipping container through the louvers.

9. The data center of claim 1, wherein exhaust louvers are disposed along the first side wall of the shipping container.

* * * * *